Oct. 4, 1966 J. J. BOYAJIAN 3,277,388
SIGNAL ATTENUATION NETWORK
Filed March 27, 1964
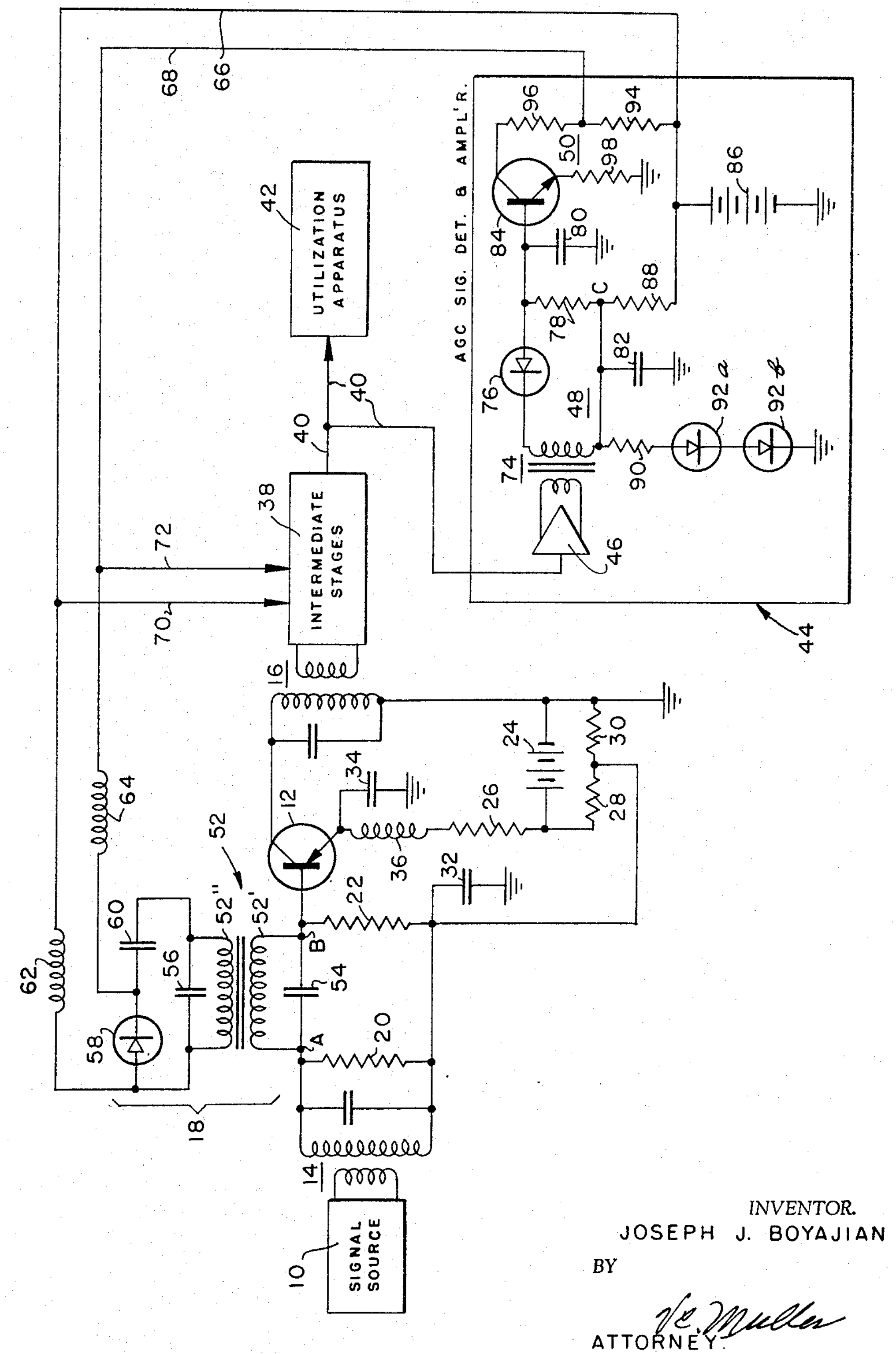
INVENTOR.
JOSEPH J. BOYAJIAN
BY
V.E. Muller
ATTORNEY.

United States Patent Office 3,277,388
Patented Oct. 4, 1966

3,277,388
SIGNAL ATTENUATION NETWORK

Joseph J. Boyajian, Los Gatos, Calif., assignor to the United States of America as represented by the Secretary of the Navy Filed Mar. 27, 1964, Ser. No. 355,514
2 Claims. (Cl. 330—129)

The invention described herein may be manufactured and used by or for the Government of the United States of America for governmental purposes without the payment of any royalties thereon or therefor.

The present invention relates generally to electronic circuits for variably attenuating signals, and more particularly to such circuits as employed for AGC (automatic gain control) in radio or in radar receiver systems.

The term AGC is here to be understood in its generalized sense as referring to any technique whereby the effective gain of an amplifier system is controlled to maintain output-signal level within comparatively narrow limits despite extreme variations of input-signal strength.

While the invention is generally applicable to many types of amplifiers and of utility in many different circuit environments, it is specifically intended for use in the receiver sections of anti-radar missiles which must effect homing action under conditions of extreme intensity variations of signals received from say a pulsed-radar installation; the invention will therefore be described with specific reference to an embodiment intended for such environmental use in particular, and further wherein the AGC action is imposed upon IF (intermediate frequency) transistor amplifier stages, and wherein the AGC signal is derived from the AF (audio-frequency) modulation carried by the received signal due to radar emission characteristics.

In the usual AGC transistor amplifier circuit as employed in superheterodyne receivers, a D.-C. (direct current) control signal, generally derived from the receiver's second detector, is applied directly to the IF amplifier transistors in a manner to vary either the emitter current or collector voltage and for the purpose of automatically controlling the amplifier gain. Such techniques, while generally satisfactory for use in broadcast radio receivers, nevertheless involve disadvantages which become of particular importance in the case of receivers for anti-radar missile applications, which disadvantages arise from variation of direct currents through the transistor; when the transistor base and emitter currents change from their optimum design values, the transistor parameters change, stability of performance characteristics under the condition of temperature variation deteriorates, and the noise figure is seriously degraded. Also, input signals into the transistor circuits become distorted because of the nonlinear characteristics which result when the transistor is biased close to either cutoff or saturation; the controlled transistor stage can ordinarily properly handle only a comparatively narrow range of input-signal intensity variations.

It is an object of the invention to provide a novel current-controlled variable attenuator having general application to signal attenuation circuits and specifically intended for advantageous use in amplifier AGC circuits.

It is another object of the invention to provide a novel and improved AGC amplifier circuit which overcomes the foregoing described disadvantages of prior art AGC amplifier systems.

It is another object of the invention to provide a novel gain control circuit for tuned transistor amplifier stages to accomplish variations of gain without affecting the center-frequency or the selectivity of the tuned circuits of the amplifiers.

Another object is to provide an effective and reliable gain control circuit for transistor amplifiers, having the feature that amplifier gain may be varied without a concomitant variation in transistor input or output impedance.

A further object of the invention is to provide an effective and reliable variable attenuation circuit for transistor amplifier use which does not alter the amplifier input or output impedances throughout the range of variable attenuation operation.

These and other objects and advantages of the present invention will be readily appreciated as the same becomes better understood by reference to the following description when considered in connection with the accompanying drawing wherein the single figure is a combination block and schematic diagram of an exemplary embodiment of the invention.

Referring now to the drawing, in the case where signal source 10 may for example represent simply an antenna for signal reception at predetermined frequency, the following stage or stages can be fixed-tuned to carrier frequency and provided with AGC, but in this particular instance signal source 10 is to be understood as further including frequency conversion circuitry such that the succeeding stage employing the PNP-type transistor 12 operates at an intermediate frequency of say 20 mc./s. (megacycles per second), and wherein the input and output coupling circuits 14 and 16, respectively, and the variable-impedance network 18, are all designed for operation at the IF frequency. Except for inclusion of resistors 20, 22 and variable-impedance network 18 (which form part of the AGC circuitry), the IF amplifier including transistor 12 may be of any conventional type, for example wherein transistor 12 is employed in common-emitter configuration as illustrated. Battery 24 and the stabilizing resistor 26 here serve to supply the transistor 12 collector-to-emitter voltage, and the voltage divider consisting of resistors 28 and 30 serve to set the base-to-emitter bias voltage. Bypass capacitors 32 and 34 serve to complete the signal path for the input and output circuits of the transistor amplifier, and RF (radio-frequency) choke 36 serves to reduce to negligible value the magnitude of signal currents induced in the battery voltage supply circuits.

While in a general case the gain-controlling voltage and current, employed in the present invention as will be described, can be derived by demodulation of an amplified RF carrier signal (or, equivalently and more usual, by demodulation of an amplified IF signal), in the particular embodiment disclosed herein, intended for use with received signals which arrive from a pulsed-radar source, it is more convenient to derive such gain-controlling current from the AF modulation which in this instance may have a frequency say of the order of 1 or 2 kc./s. (kilocycles per second). The intermediate stages 38 are therefore here to be understood as including not only additional AGC transistor amplifiers similar to that thus far described, but also a demodulator which extracts and provides a lead 40 the AF modulation signal. Utilization apparatus 42 in the case of a homing-missile application of the present invention would include other signal processing circuits and missile steering and control circuits and devices. The illustrated embodiment is completed, as to the AGC system of the present invention, by use of an AGC signal detector and amplifier unit 44 in which the AF signal supplied via lead 40 is amplified in amplifier section 46, then converted by rectifier section 48 to a corresponding varying D.C. voltage, in turn converted by amplifier section 50 to the attenuator-controlling direct current which affects the network 18 impedance as will be described. It should be noted that the attenuation-control current supplied by AGC signal detector and amplifier 44 varies inversely as the AF signal amplitude.

Returning to the IF amplifier stage shown in detail, AGC action is provided by use of the variable-impedance network 18 which together with resistor 22 serves as a voltage divider to effect attenuation of the input IF signal as applied to transistor 12. Primary winding 52′ of ferrite-cored transformer 52, inserted in the amplifier circuit between the input coupling circuit 14 and the input (base) electrode of transistor 12, and secondary winding 52″ of transformer 52, are tuned by capacitors 54 and 56, respectively, to the operating frequency of the amplifier stage. Secondary winding 52″ is further shunted by series-connected diode 58 and D.C. blocking capacitor 60, where capacitor 60 is many times greater in capacity value than that of capacity 56, and where the resistance of diode 58 preponderates over the reactance presented by capacitor 60 at the operating frequency. The RF chokes 62 and 64 present high impedance at the operating frequency and serve to minimize signal loss and impedance network 18 insertion loss which would be increased by signal entry to amplifier section 50 via leads 66, 68.

The magnitude of the effective or resultant impedance of the network 18 presented to terminals A and B, which may be taken as essentially resistive and termed R herein, is dependent upon the loading resistance $R_d$ presented by diode 58, in turn dependent upon the magnitude of control current supplied to diode 58 by the AGC signal detector and amplifier unit 44 via leads 66 and 68. With $R_s$ representing the resonance-condition impedance presented by the tuned transformer itself at terminals A and B, and in a simplified example taking a unity turn ratio for transformer 52, the effective or resultant impedance presented by network 18 at terminals A and B is given by the general equation.

$$R=(R_d \cdot R_s)/(R_d+R_s)$$

Under the condition wherein the current through diode 58 is zero or negligible, diode 58 resistance $R_d$ is much greater than tuned transformer impedance $R_s$, transformer 52 is essentially unloaded and operates at its normal Q factor, and the effective impedance R is then substantially equal to the resonant transformer impedance $R_s$. Under the oppoiste condition wherein the current through diode 58 is of the order of say two milliamperes as supplied by AGC signal detector and amplifier unit 44 in response to low level IF signal inputs, diode 58 resistance $R_d$ is much smaller than the transformer impedance $R_s$, transformer 52 becomes strongly loaded and its Q factor is greatly lessened, and the resultant impedance R is then substantially equal to the comparatively small value $R_d$ presented by diode 58 under this current flow condition.

Thus, the Q factor of transformer 52 the resultant impedance R presented at terminals A and B, and the attenuation imposed upon the input signal before application to the described IF amplifier, are inverse functions of the control current supplied to the variable impedance network 18 from AGC signal detector and amplifier unit 44 and correspondingly direct functions of the input signal; a small input IF signal results in a comparatively large control current and minimum attenuation of the IF signal as applied to the control (base) electrode of the IF amplifier transistor, and a large input IF signal results in a comparatively small control current and maximum attenuation of the IF signal, whereby the effective gain of the amplifier system is controlled to maintain output-signal level within comparatively narrow limits.

It should be noted that the signal is not distorted by diode clipping since the tuned circuits of transformer 52 also operate as wave shaping networks, that resistors 20 and 22 are provided to keep the impedance seen by transistor 12 and by the preceding stage fairly constant despite impedance changes of the variable impedance network and that, contrary to usual practice and overcoming disadvantages arising therefrom, the IF amplifier gain control current is isolated from the IF amplifier transistor 12. It will also be understood that succeeding similar IF stages (not shown but already described as included in the intermediate stages unit 38) also are provided with gain control current via leads 70, 72 as indicated.

While the AGC signal detector and amplifier unit may take any form suitable to provide an attenuation D.C. control signal of magnitude varying inversely with the input signal level, to insure completeness of disclosure there is here shown and briefly described one which has been found very satisfactory in practice. In the AGC signal detector and amplifier unit 44 which operates upon the AF modulation signal, supplied via lead 40, to derive therefrom the attenuator control signal, rectifier section 48, which is coupled by ferrite-cored transformer 74 to the preceding AF amplifier section 46, further comprises diode 76 and resistor 78. In a manner similar in end function to that employed for delayed AVC action in broadcast radio receivers, the negative D.C. voltage developed across resistor 78, smoothed by capacitors 80 and 82, is not effective to result in initiating IF signal attenuation (by decreasing the currents through transistor 84 of amplifier section 50) until the resistor 78 voltage exceeds a threshold set by the voltage developed at point C as a result of voltage divider action in the circuit comprising battery 86, resistors 88 and 90, and diodes 92*a* and 92*b*. Battery 86 also serves, in connection with resistors 94, 96 and 98, to provide the collector-to-emitter voltages for proper operation of transistor 84, and for development of a suitable attenuator control voltage across resistor 94. Battery 86 could be eliminated by using battery 24 as the sole voltage source, but is here shown as a separate voltage source for the AGC signal detector and amplifier unit 44 to simplify reading of the schematic circuit.

As an example of a practical embodiment of the present invention, with the IF amplifier and variable impedance network operating with input signals at a frequency of 20 mc./s., and the AGC signal detector and amplifier deriving its output D.C. control signal from an AF signal having a frequency of the order of 2 kc./s., circuit components as follows have been employed with satisfactory results:

| | |
|---|---|
| Choke 64 | 2N1742. |
| Transistor 12 | 2N736. |
| Transistor 84 | 1N459A. |
| Diode 58 | 1N459A. |
| Diode 76 | 1N67A. |
| Diode 92*a* | 1N459A. |
| Diode 92*b* | 12 volts. |
| Battery 24 | 12 volts. |
| Battery 86 | 3 to 1 ratio. |
| Transformer 52 | 0.01 microfarad. |
| Capacitor 32 | 0.01 microfarad. |
| Capacitor 34 | 1 picofarad. |
| Capacitor 54 | 40 picofarad. |
| Capacitor 56 | .01 microfarad. |
| Capacitor 60 | 100 microfarad. |
| Capacitor 80 | 10 microfarad. |
| Capacitor 82 | 1000 ohms. |
| Resistor 20 | 1000 ohms. |
| Resistor 22 | 390 ohms. |
| Resistor 26 | 1000 ohms. |
| Resistor 28 | 8350 ohms. |
| Resistor 30 | 10000 ohms. |
| Resistor 78 | 7500 ohms. |
| Resistor 88 | 2200 ohms. |
| Resistor 90 | 510 ohms. |
| Resistor 94 | 910 ohms. |
| Resistor 96 | 470 ohms. |
| Resistor 98 | 40 microhenries. |
| Choke 36 | 40 microhenries. |
| Choke 62 | 40 microhenries. |

Having described the invention, it will now be understood that AGC action in the described embodiment is provided without signal distortion under large input signal conditions, that the direct currents through the IF amplifier transistors remain substantially constant and the transistor parameters correspondingly remain at their optimum design values, and that the described embodiment can handle a wider range of input signal magnitudes than has been possible heretofore without recourse to circuits of greater complexity and number of circuit components. In the described embodiment, the maximum voltage attenuation has been found to be 35 db per attenuator network, with a 2 db insertion loss.

Obviously many modifications and variations of the present invention are possible in the light of the above teachings. It is therefore to be understood that within the scope of the appended claims the invention may be practiced otherwise than as specifically described.

What is claimed is:

1. A current-controlled signal-voltage division circuit for operation in connection with input signals at a substantially fixed frequency, said circuit comprising:

(a) a fixed impedance, (b) a variable impedance network including a transformer having primary and secondary circuits tuned to said frequency, (c) said primary circuit being connected in series with said fixed impedance, (d) said variable impedance network further including, in shunt with the secondary circuit thereof, a diode in series connection with a capacitor, and (e) means for supplying a direct current of controllable magnitude to said diode, (f) whereby an input signal at said fixed frequency applied across said series-connected fixed impedance and variable impedance network primary circuit appears across said fixed impedance at a lesser magnitude varying inversely with the magnitude of current supplied to said diode.

2. In a signal processing system, in combination:

(a) an amplifier including at least one stage having an amplifier device, for operation with signals having predetermined frequency, and for providing amplified output signals at said frequency, (b) a current-controlled signal attenuation network including a transformer having primary and secondary circuits tuned to said predetermined frequency, said primary circuit being connected with a resistive impedance as a signal voltage divided circuit and preceding said amplifier device as to signal processing sequence, (c) said network further including in shunt with the secondary circuit thereof a diode in series connection with a capacitor, (d) means for deriving, from said amplified output-signals, an AGC voltage varying inversely with the magnitude of said output signals, and (e) means for applying said AGC voltage to said diode, (f) whereby said primary circuit presents, to signals applied thereto at said frequency, an essentially resistive impedance of magnitude varying inversely with the magnitude of AGC voltage applied to said diode, and (g) whereby the effective gain of said amplifier is automatically controlled to maintain output-signal level within comparatively narrow limits despite extreme variations of input-signal strength.

References Cited by the Examiner

UNITED STATES PATENTS

| | | | |
|---|---|---|---|
| 2,981,835 | 4/1961 | Webster et al. | 325—319 |
| 3,072,849 | 1/1963 | Firestone | 325—319 |

ROY LAKE, *Primary Examiner.*

R. P. KANANEN, J. B. MULLINS, *Assistant Examiners.*